(12) United States Patent
Mallikararjunaswamy

(10) Patent No.: US 7,956,384 B2
(45) Date of Patent: Jun. 7, 2011

(54) CLOSED CELL CONFIGURATION TO INCREASE CHANNEL DENSITY FOR SUB-MICRON PLANAR SEMICONDUCTOR POWER DEVICE

(75) Inventor: Shekar Mallikararjunaswamy, San Jose, CA (US)

(73) Assignee: Alpha & Omega Semiconductor Ltd. (BM)

( * ) Notice: Subject to any disclaimer, the term of this patent is extended or adjusted under 35 U.S.C. 154(b) by 461 days.

(21) Appl. No.: 11/473,938

(22) Filed: Jun. 23, 2006

(65) Prior Publication Data
US 2007/0295996 A1  Dec. 27, 2007

(51) Int. Cl.
*H01L 27/118* (2006.01)
*H01L 23/52* (2006.01)
*H01L 27/088* (2006.01)
*H01L 27/105* (2006.01)

(52) U.S. Cl. ........ 257/203; 257/204; 257/205; 257/207; 257/208; 257/211; 257/E27.06; 257/E27.081

(58) Field of Classification Search ............ 257/342, 257/207, 365, 366, 203, 204, 205, 208, 211, 257/E27.06, E27.081
See application file for complete search history.

(56) References Cited

U.S. PATENT DOCUMENTS

| | | | |
|---|---|---|---|
| 5,355,008 A | 10/1994 | Moyer et al. | |
| 5,447,876 A | 9/1995 | Moyer et al. | |
| 5,517,046 A * | 5/1996 | Hsing et al. | 257/336 |
| 6,069,396 A | 5/2000 | Funaki | |
| 6,140,687 A * | 10/2000 | Shimomura et al. | 257/401 |
| 6,287,922 B1 * | 9/2001 | Yu et al. | 438/299 |
| 6,388,292 B1 * | 5/2002 | Lin | 257/356 |
| 6,818,950 B1 | 11/2004 | Mallikararjunaswamy | |

* cited by examiner

*Primary Examiner* — Phat X Cao
*Assistant Examiner* — Diana C Garrity
(74) *Attorney, Agent, or Firm* — Bo-In Lin

(57) ABSTRACT

A semiconductor power device supported on a semiconductor substrate that includes a plurality of transistor cells, each cell has a source and a drain region disposed on opposite sides of a gate region in the semiconductor substrate. A gate electrode is formed as an electrode layer on top of the gate region for controlling an electric current transmitted between the source and the drain regions. The gate electrode layer disposed on top of the semiconductor substrate is patterned into a wave-like shaped stripes for substantially increasing an electric current conduction area between the source and drain regions across the gate.

14 Claims, 9 Drawing Sheets

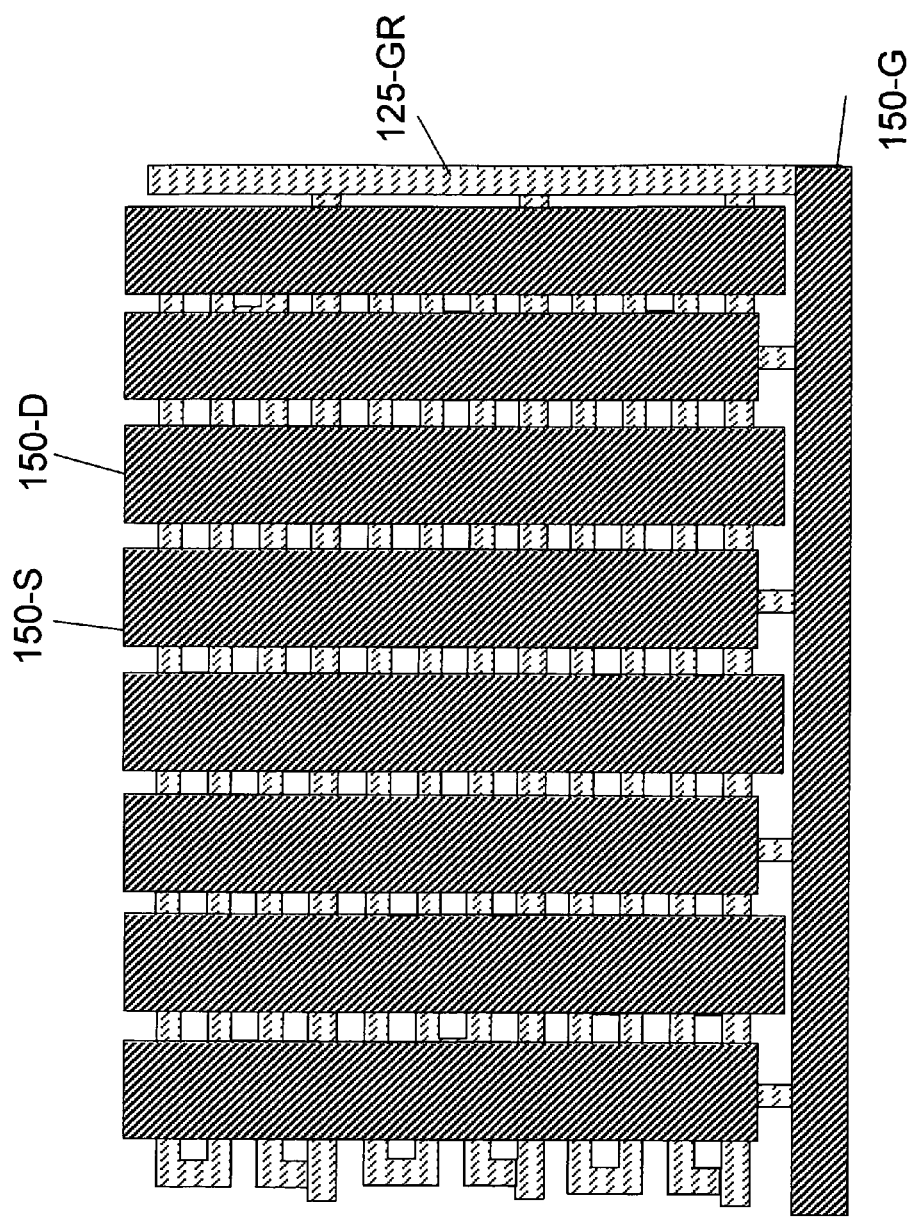

CLOSED CELL CONFIGURATION TO INCREASE CHANNEL DENSITY FOR SUB-MICRON PLANAR SEMICONDUCTOR POWER DEVICE

BACKGROUND OF THE INVENTION

1. Field of the Invention

The invention relates generally to the planar semiconductor power devices. More particularly, this invention relates to an improved and novel closed cell configuration with increased channel density, i.e., the channel width per unit of semiconductor area, for sub-micron planar semiconductor power device.

2. Description of the Prior Art

Conventional technologies have reached a limit to reduce the on-resistance of lateral MOS transistors by increasing the channel width in a given MOS transistor area. Reduction of the on-resistance for a cellular array of MOS transistors is desirable because of the lower power loss and ability to conduct high currents. In low voltage application, e.g., MOSFETS application for a voltage lower than 12 volts, lateral MOSFETs offer lower device resistance than vertical double-diffused metal oxide field effect transistors (VDMOS). However, in design large area lateral MOSFETs, the contribution due to parasitic resistance such as Metal bussing increases. It is well know in the art that a VDMOS can achieve low on resistance when measured in term of a unit area of cellular cells. Such low on-resistance is achieved with whole surface area functioning as a drain electrode. Such configuration allows high density of vertically parallel transistors to connect in parallel. These parallel vertical current channels are formed between a source region, covering a large area of a top surface, and the drain electrode connected to a bottom surface. However, there are applications where the VDMOS transistors cannot be conveniently integrated. Under these circumstances, a lateral MOS transistor is generally used despise the fact that a vertical MOS transistor can achieve a lower on-resistance than the lateral MOS transistors.

In order to overcome this drawback of higher on-resistance, a first and most straightforward way to reduce the on-resistance contribution from metal and contact for a lateral MOS resistance is to increase the width of the contacts and metal stripes However, a greater width of the contact metal stripes increases the areas occupied by the transistor array. The reduction of the on-resistance is obtained at the expense of increasing the areas occupied by the transistor array. For this reason, with a strong demand to miniaturize the electronic devices, this method does not provide an effective solution to reduce the on-resistance of the lateral MOSFET devices.

Various layouts of the cell arrays are explored to achieve the purpose of increasing the channel width per unit area (W/area). FIG. 1A shows an alternate configuration with a stripe cell configuration to obtain large channel width by connecting several MOSFETs in parallel. In these stripe cell arrays, alternating drain and source stripes are placed next to each other so that each drain/source stripe shares with adjacent source/drain thereby reducing the overall area of the device. The increased channel width provided by the stripe cell is able to enhance the power management efficiency in circuits such as switching regulator, low dropout regulators and discrete MOSFET drivers.

FIG. 1B is shows a cellular transistor array implemented with a polysilicon gate mesh. The polysilicon gate mesh formed as square cell. As shown in FIG. 1B, the square cell array further increases the channel width per unit area (W/area) by drawing a mesh of polysilicon lines to form alternating source and drain cells that are connected in parallel by metal. More particularly, in U.S. Pat. No. 5,355,008, a square mesh array is implemented in a MOSFET device. By forming the openings in the polysilicon mesh to be in a diamond shape, i.e., having a long diagonal and a short diagonal), the source and drain metal strips, arranged in the direction of the short diagonals, can be made wider and shorter, thus reducing the on-resistance of the transistor without increasing the area of the transistor.

However, as there are strong demands to provide the semiconductor power devices for larger current switching operations with low on-resistance, there still exists a need to further increase the channel density (W/area). Therefore, it is necessary to provide alternate layout for the lateral transistor cell arrays to further increased the channel width per unit area (W/area). It is also desirable that the on-resistance can be further reduced without sacrificing the transistor areas. Furthermore, it is desirable that the lateral transistor arrays can be manufactured with standard CMOS technologies such that the above discussed difficulties and limitations can be resolved.

SUMMARY OF THE PRESENT INVENTION

It is therefore an aspect of the present invention to provide a new and improved lateral semiconductor power device implemented with novel layout to increase the channel width per unit area. The on-resistance can be further increased with this novel layout of cell array suitable for large current switching operations such that the above discussed problems and difficulties can be resolved.

Specifically, it is an aspect of the present invention to provide improved lateral semiconductor power device implemented with a new layout of transistor cells in a transistor cell array. In this new transistor cell array, the gate regions formed generally with polysilicon disposed between the source and drain regions are configured to have a wave-like configuration. The polysilicon gate regions are formed to comply with the minimum spacing rule allowed by the technology. Since the polysilicon gate regions are drawn to a minimum spacing with the source and drain contacts between the polysilicon gates formed with a wave-like pattern, a higher channel density is achieved. A higher channel density translated into a higher channel width per unit area (W/area).

Briefly in a preferred embodiment this invention discloses a lateral semiconductor power device supported on a semiconductor substrate. The lateral semiconductor power device includes a plurality of transistor cells each includes a source and a drain region disposed on opposite sides of a gate region in the semiconductor substrate wherein a gate electrode is formed as an electrode layer on top of the gate region for controlling an electric current transmitted between the source and the drain regions. The gate electrode layer disposed on top the semiconductor layer is patterned into a wave-shape configuration for substantially increasing an electric current conduction area between the source and drain regions across the gate.

This invention further discloses a method for configuring a semiconductor power device supported on a semiconductor substrate. The method includes a step of forming a plurality of transistor cells each with a source and a drain region disposed on opposite sides of a gate region in the semiconductor substrate. The method further includes a step of forming a gate electrode layer on top of the gate region on top of the gate region for controlling an electric current transmitted between the source and the drain regions and patterning the gate electrode layer into a wave-shaped stripes for substantially increasing an electric current conduction area between the source and drain regions across the gate.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 2A to 2E are a serial of top views of a MOSFET cell array for showing the novel layout of this invention wherein the polysilicon gates are configured with wave-shaped patterns and metal layers for contacting to the drain, the source and the gate are formed.

DETAILED DESCRIPTION OF THE METHOD

Figure 1A:
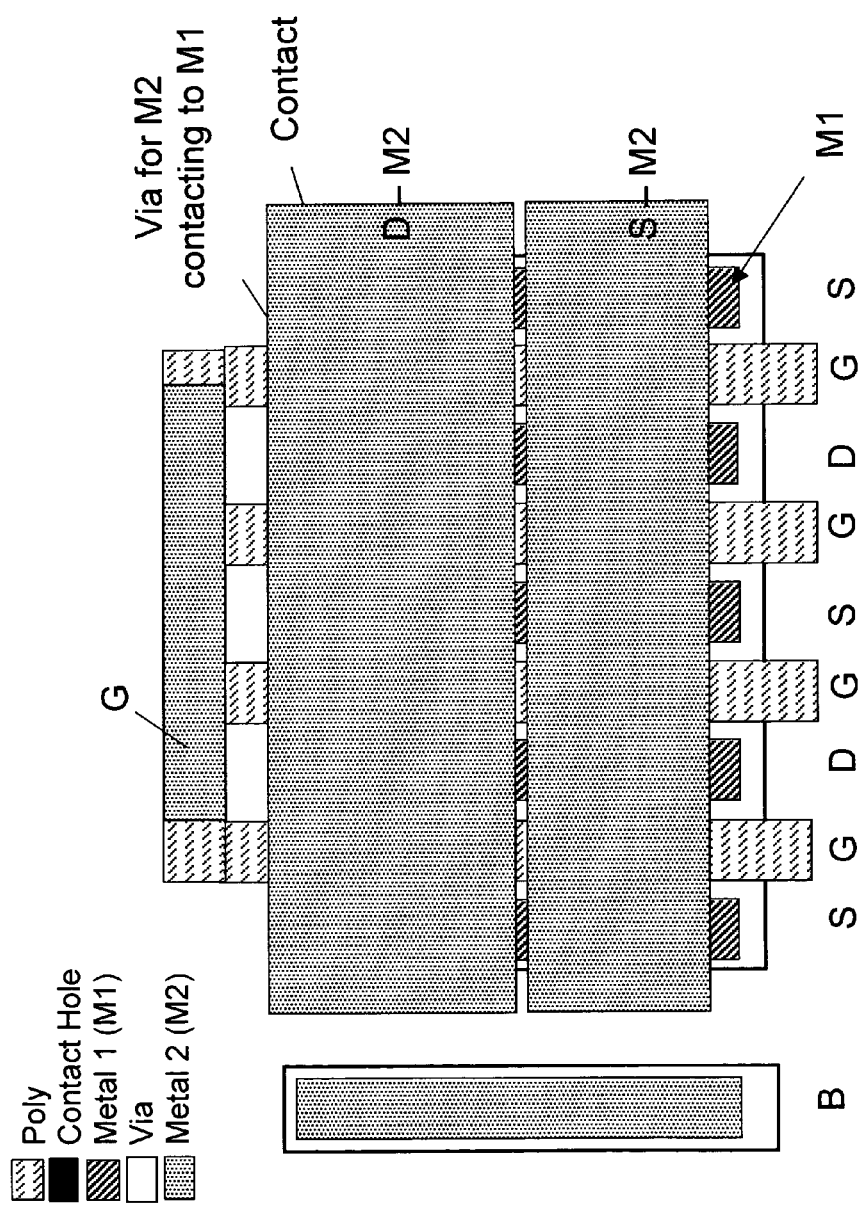
FIGS. 1A to 1B are top views of lateral MOSFET device configured with stripe cells and square cells respectively for increasing the channel width per unit area as that implemented in conventional devices.
Figure 1B:
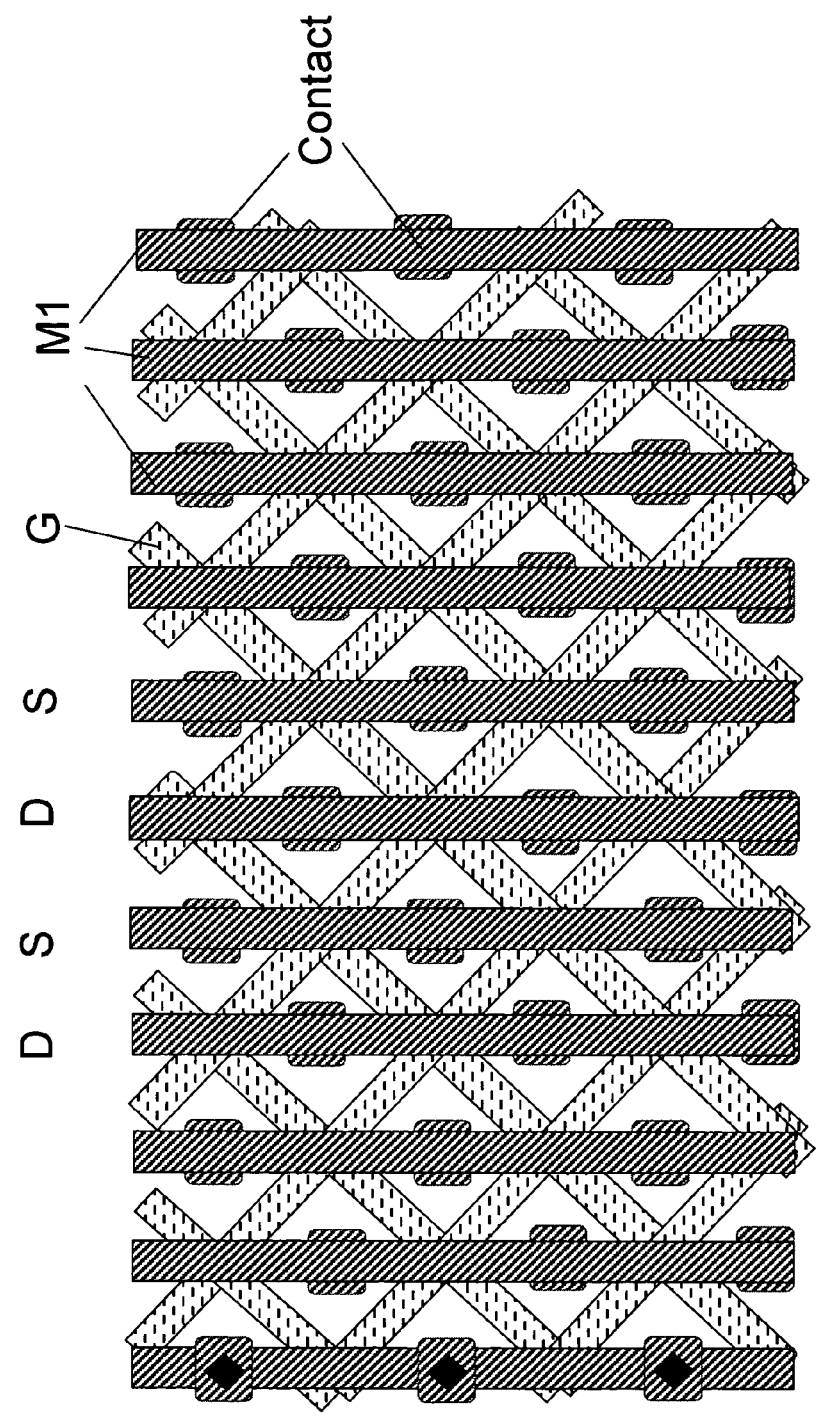
Figure 2A:
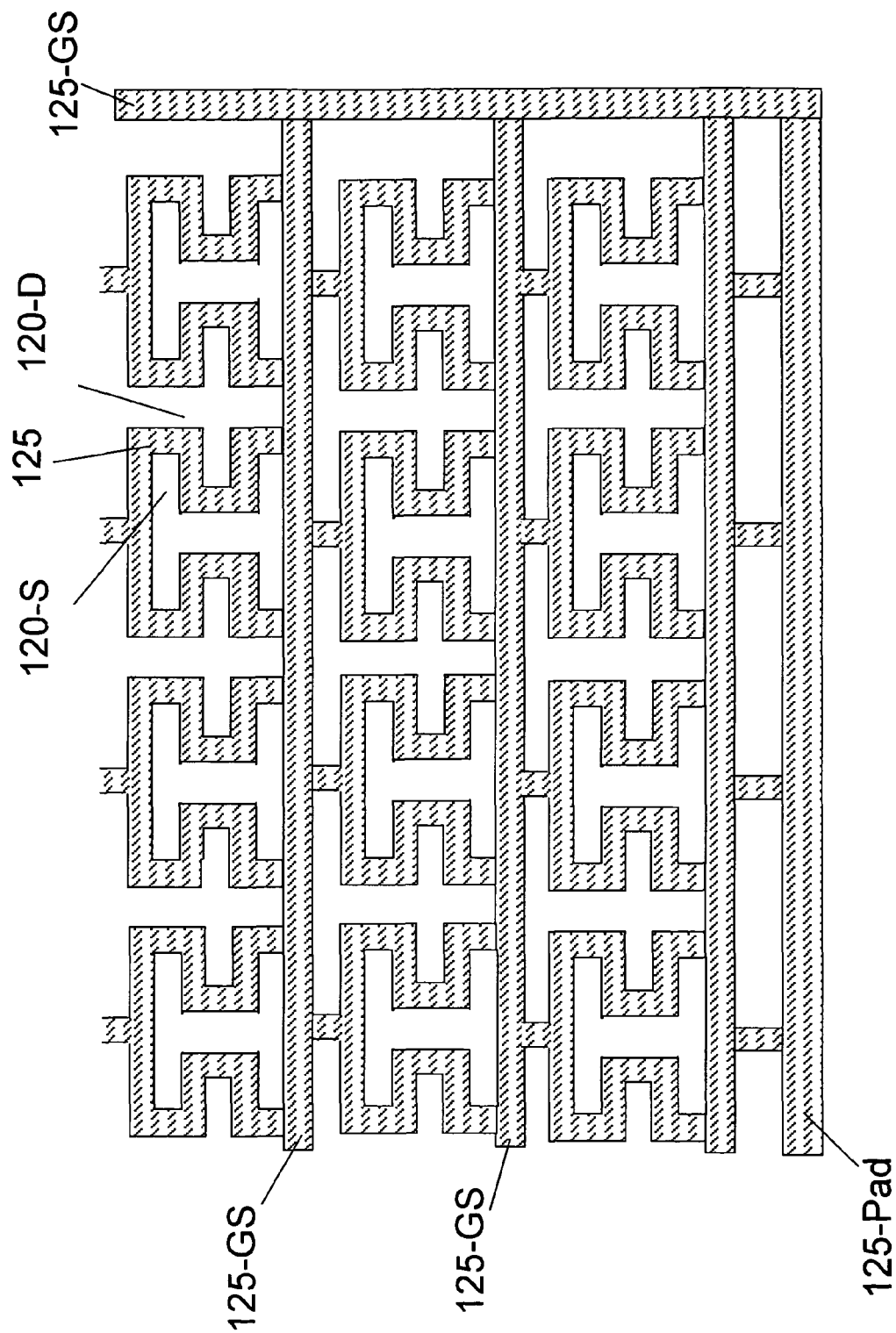

Referring to FIGS. 2A to 2E for a serial of top views for showing the polysilicon layout in FIG. 2A and the processes in forming contacts and the source, drain and gate metal layers for providing electrical contacts for the lateral semiconductor power device of this invention. FIG. 2F is a side cross sectional view of the lateral semiconductor power transistor cell across line A-A' in FIG. 2A. As shown in FIGS. 2F and 2A, the lateral semiconductor power device 100 is supported on a semiconductor substrate 105 formed with an epitaxial layer 110 with a P-well 115 formed in the epitaxial layer 110. Alternatively, the P-well 115 may be formed directly on top of substrate 105 without epitaxial layer 110. The semiconductor power transistor cell further includes a source region 120-S and a drain region 120-D with a polysilicon gate 125 disposed on top of a gate oxide layer 130 for controlling a channel between the source and the drain regions. The semiconductor power transistor cell is covered by an insulation layer 135 opened with contact openings 140-S and 140-D filled with source and drain contact metal 150-S and 150-D. A salicided layer 142 extends the contact to the source and drain regions away from the contact opens to reduce the source/drain silicon resistance. The semiconductor power transistor cell further includes a second metal layer 160 on top of metal 150-S and 150-D separated by an insulation layer 152. The second metal layer 160 further consists of a 160-S portion serving as a source pad and a 160-D portion (not shown) serving as a drain pad. Source pad 160-S is connected to source metal 150-S through inter-metal connection via 155-S. Drain pad 160-D is connected to drain metal 155-D through inter-metal connection via 155-D (not shown).

Figure 2B:
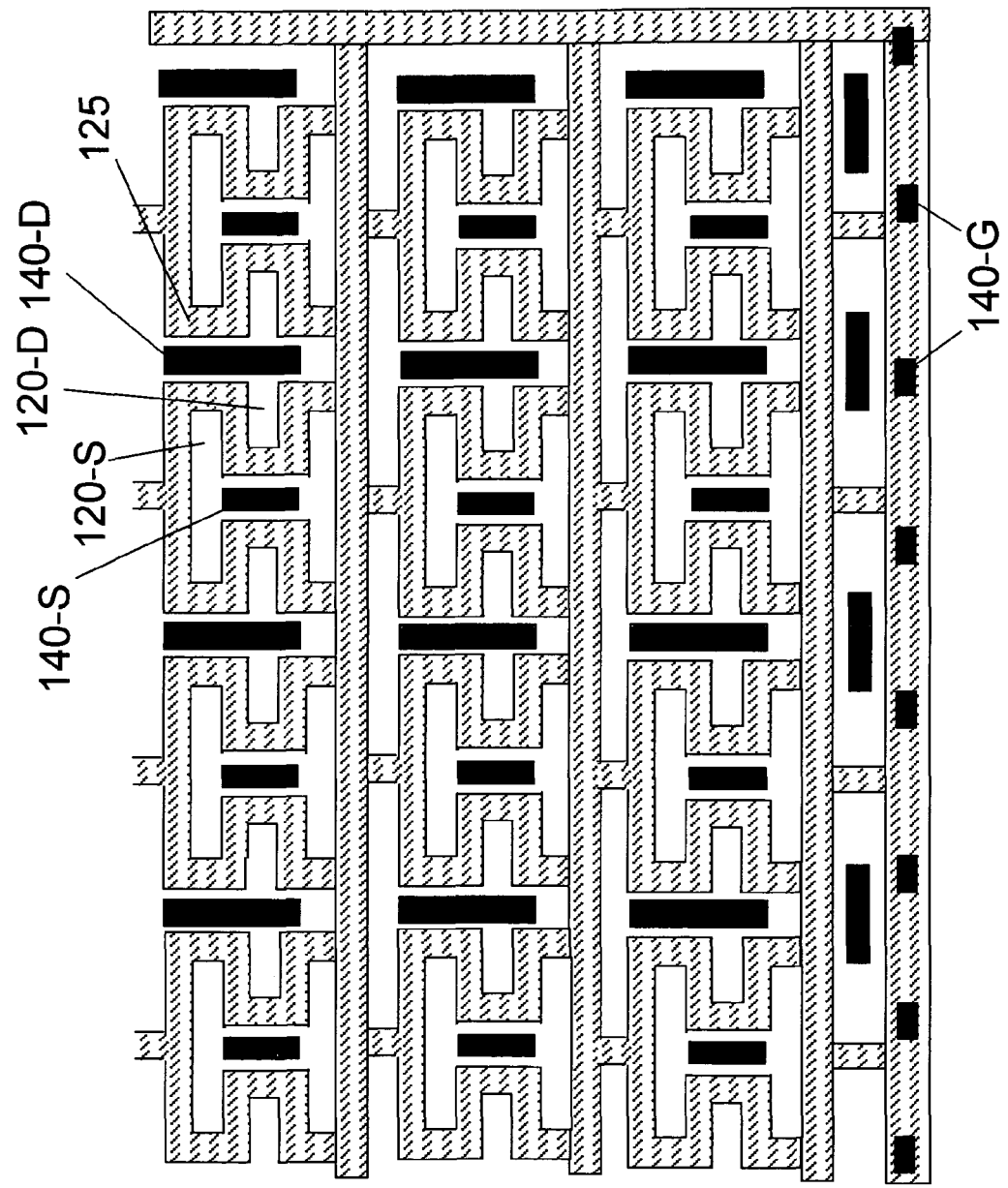
Figure 2D:
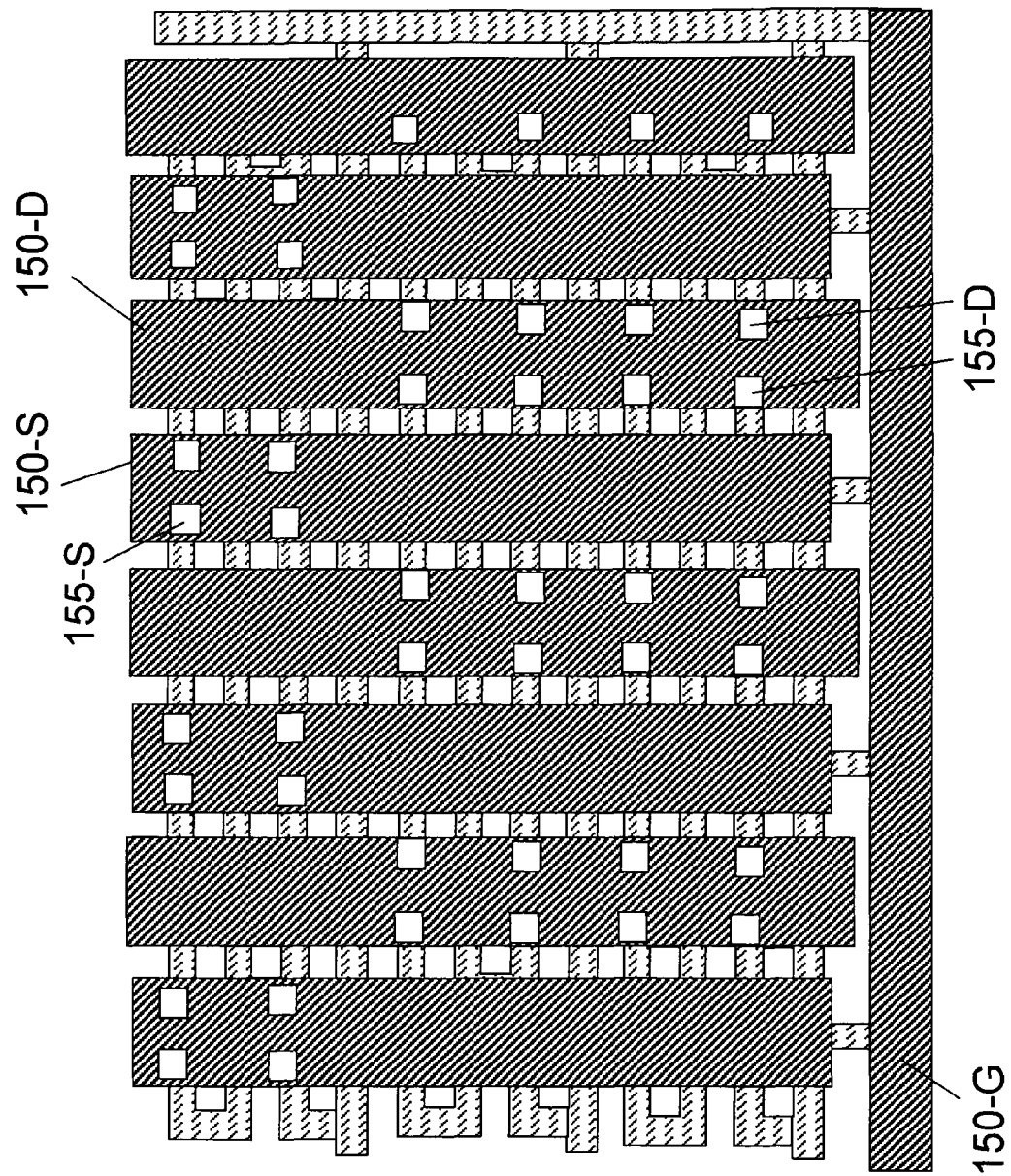
Figure 2E:
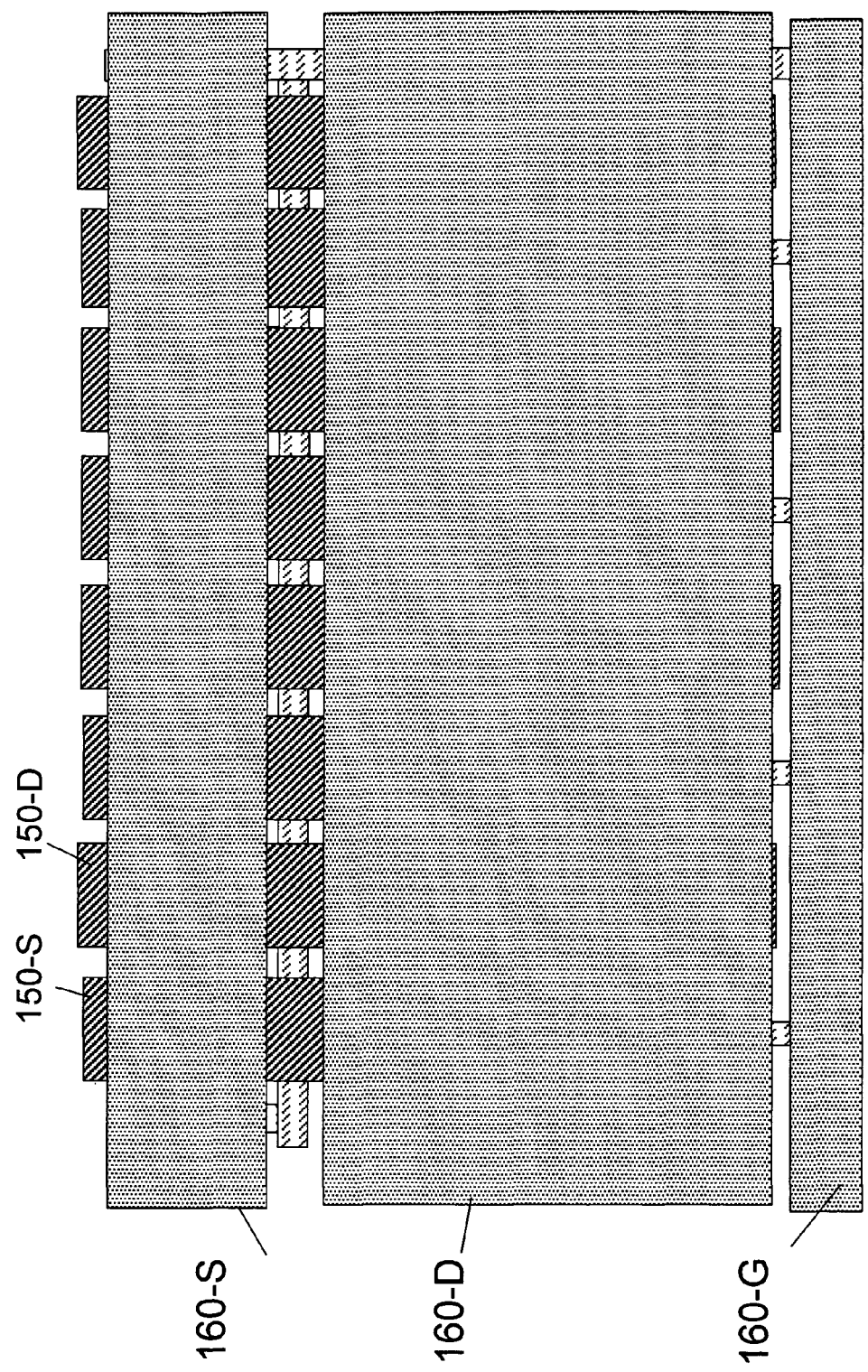
Figure 2F:
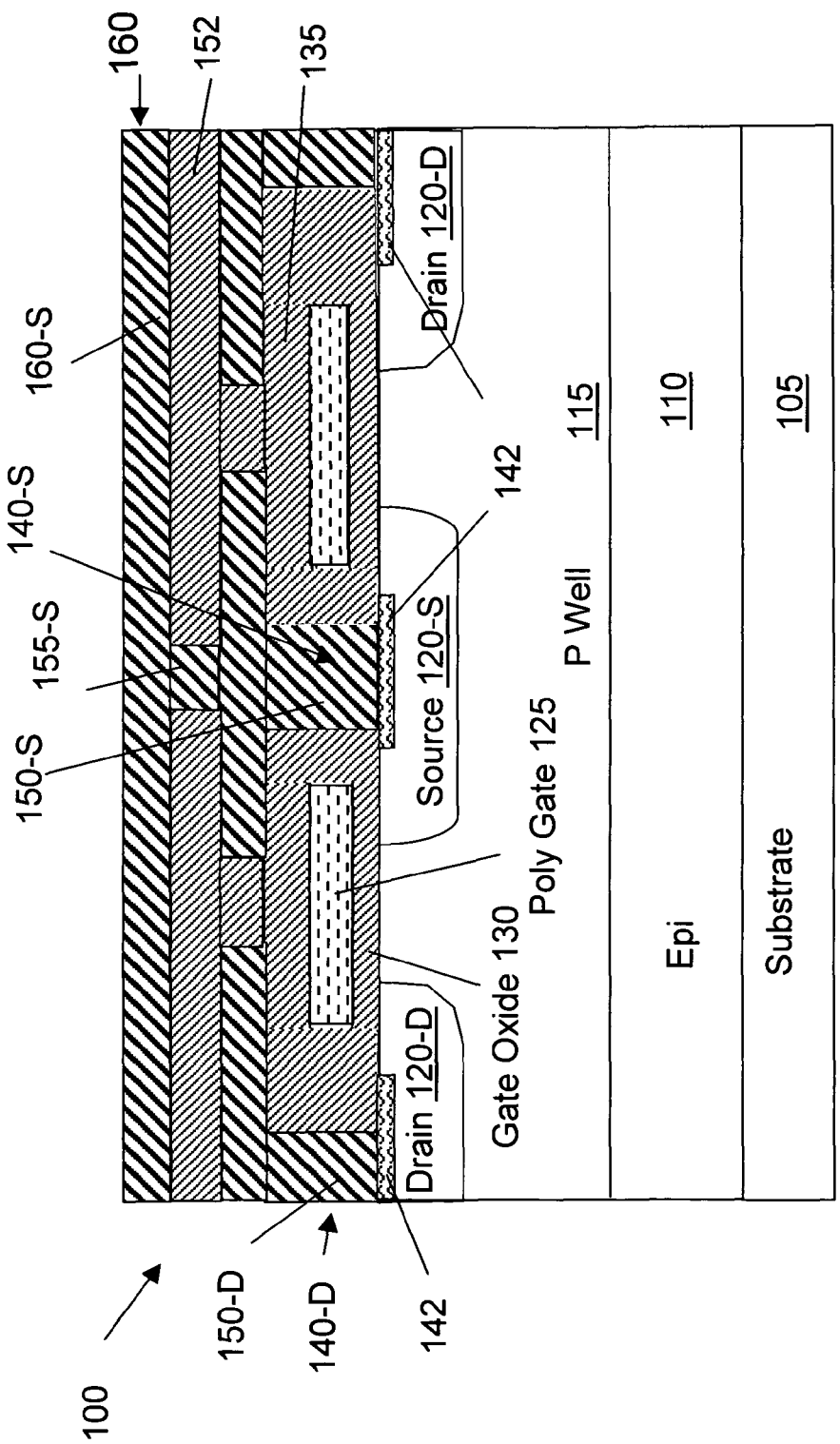
FIG. 2F is a side cross sectional view for showing the cell structure across the A-A' shown in FIG. 2A.

Referring to FIG. 2B, after the device is fabricated with the gate 125 and the source and drain regions 120-S and 120-D respectively in place, then a silicide layer 142 (see FIG. 2F) is formed. The manufacturing processes proceed with the deposition of a passivation layer. Then, Contact openings are etched. A plurality of source and drain contact openings 140-S and 140-D are formed for contacting the source regions 120-S and the drain regions 120-D. Also, gate contact openings 140-G are formed on top of the gate pad 125-pad for contacting the gate pad 125-pad. Referring to FIG. 2C, a first metal layer is deposited and filled in the source contact openings 140-S, the drain contact openings 140-D and the gate contact openings 140-G. The first metal layer is further patterned into a plurality of source metal 150-S, drain metal 150-D and gate metal 150-G to separate each electrode from the other. Referring to FIG. 2D, a second insulation layer is formed to cover the first patterned metal layer 150-S and 150-D. Then a plurality of inter-metal connection via 155-S and 155-D are opened through the insulation layer for connecting to the underlying metal stripes 150-S and 150-D. In the embodiment shown in FIG. 2D, the inter-metal connection via 155-S over each source metal strip 150-S is on the upper portion of the device while the inter-metal connection via 155-D over each drain metal strip 150-D is on the lower portion of the device. In another embodiment (not shown) the inter-metal connection via 155-S over each source metal strip 150-S is on the lower portion of the device while the inter-metal connection via 155-D over each drain metal strip 150-D is on the upper portion of the device. In FIG. 2E, a second metal layer is deposited to fill inter-metal connection via 155-S and 155-D. The second metal layer is further patterned into a second source metal 160-S, a second drain metal 160-D and a second gate metal 160-G. All the metal stripes 150-S connect to source metal 160-S through a plurality of inter-metal connection via 155-S and all the metal stripes 150-D connect to drain metal 160-D through a plurality of inter-metal connection via 155-D. The source metal 160-S and drain metal 160-D therefore provide source pad and drain pad for wire bonding or other connection means.

In the embodiment as shown in FIG. 2D and FIG. 2E, the source regions in the lower portion of the device is connected to the lower portion of metal strip 150-S through metal stripe 150-S to reach the inter-metal connection via 155-S. Compare to the source regions in the upper portion of device where the connection to the inter-metal connection via 155-S is directly through the upper portion of metal stripe 150-S, the source region in the lower portion of device will bear a higher resistance. The same is true for the drain region in the upper portion of the device. This increases the overall resistance.

Figure 3:
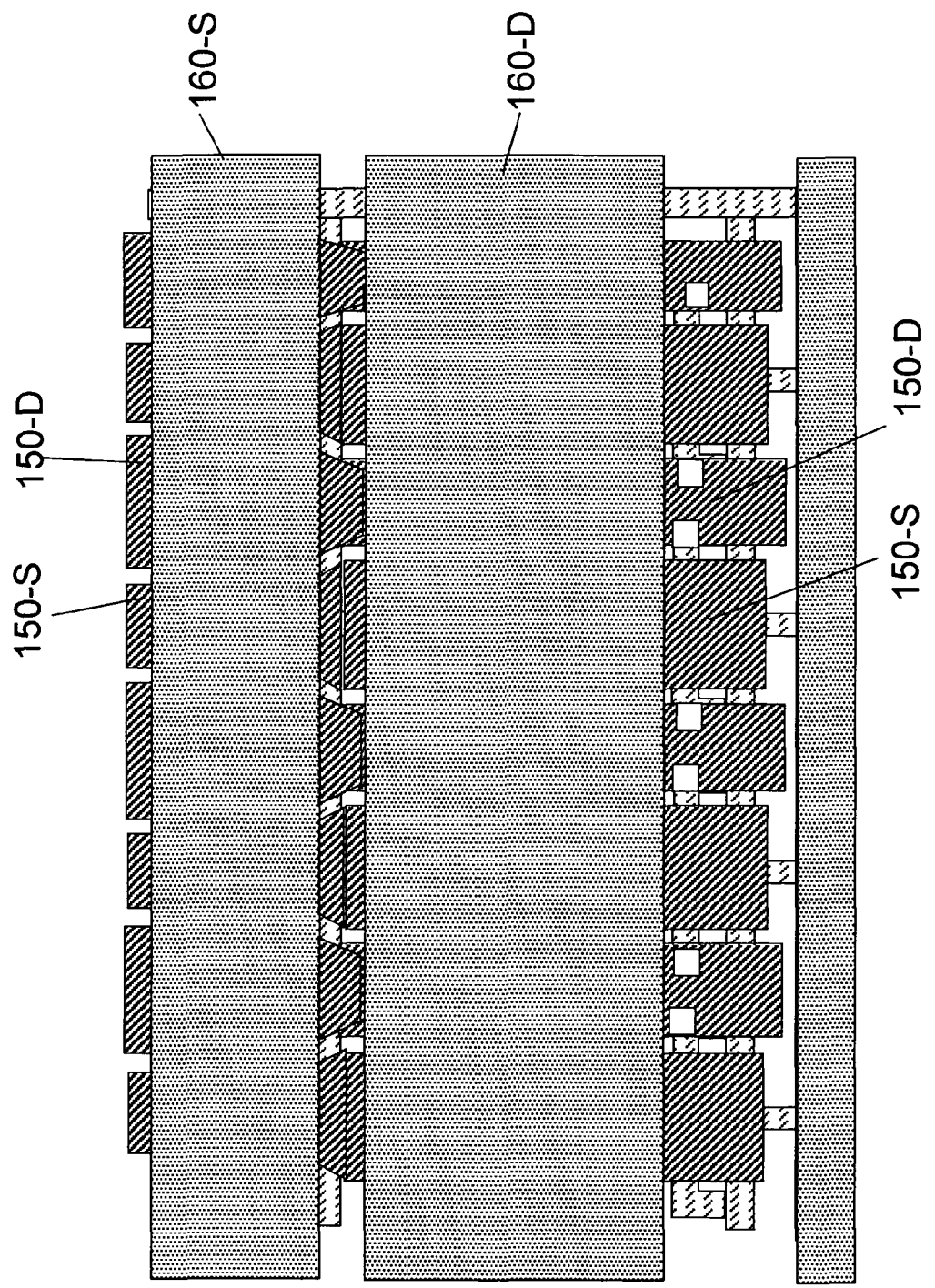
FIG. 3 is another top view for showing a different embodiment of this invention.

Referring to FIG. 3 for an alternate embodiment of this invention where the first metal layer is patterned into a plurality of M1 strip with different width for connecting to source or drain contacts. The lower portion of metal strip 150-S is wider then the upper portion to reduce lower portion source resistance. The upper portion of metal strip 150-S is narrower to make room for extending the width of metal strip 150-D in the upper portion therefore reduce the drain resistance in the upper portion. The embodiment as shown in FIG. 3 therefore reduces the overall device resistance.

According to FIGS. 2A to 2E and FIG. 3 the poly-silicon gate region of the lateral MOSFET cells separates the source and the drain region and the polysilicon gates are configured with a wave pattern. The wave pattern of the polysilicon gates is configured to comply with a minimum poly spacing rule as that allowed by current processing technology. Since the polysilicon stripe is drawn to minimum spacing without the source and drain contacts between the polysilicon wave pattern a higher channel density is obtained which translates to higher W/unit area where W stands for a sum of total channel widths.

Now the channel current between the source and drain regions are collected by the silicon source and drain regions between the polysilicon gate region before flowing into the contacts placed at the end of the wave pattern. This would mean a higher resistance for the device due to additional source/drain silicon resistance. However, in advanced sub-micron technologies the drain/source silicon resistance is reduced due to silicide formation to about a tenth of the resistance when compared with non-silicided process. Consequently the source/drain resistance does not impact the resistance of the switch.

Furthermore, the polysilicon wave pattern gates are intermittently connected to form a grid in order to reduce poly gate resistance. In addition, this new layout structure has the advantage of increasing channel density without compromising metal resistance. This is beneficial for both single metal process where wide M1 can be used to reduce metal resistance and double metal process where wider M2 bus can be drawn due to lower M1 resistance. As shown in FIG. 2A, the layout feature of the polysilicon wave pattern gates are connected to form a grid in order to reduce polysilicon gate resistance.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, other conductive material instead of polysilicon may be used. The technique can apply to both N/P type MOSFETs and LDD MOSFETs. Accordingly, it is intended that the appended claims be interpreted as covering all alterations and modifications as fall within the true spirit and scope of the invention.

I claim:

1. A semiconductor power device supported on a semiconductor substrate comprising:
   a plurality of transistor cells each having a source and a drain region disposed on opposite sides of a gate region in the semiconductor substrate wherein a gate electrode is formed as an electrode layer on top of the gate region for controlling an electric current transmitted between the source and the drain regions;
   said gate electrode layer disposed on top of said semiconductor substrate is patterned into a wave-like shaped stripes and gate runners extends across a substantial length over said semiconductor device with said wave-like shape stripes extended between and interconnected two of said gate runners for substantially increasing an electric current conduction area between the source and drain regions across the gate;
   a salicide layer disposed in an upper portion of said source region and said drain region for expanding an area of a source metal contact and a drain metal contact for reducing a drain to source resistance;
   a first insulation layer covering said semiconductor device having a plurality of contact openings opened through said first insulation layer and said contact openings are filled with source metal contacts and drain metal contacts for contacting said salicide layer in said source and drain regions respectively
   a first metal layer covering over said first insulation layer and patterned into a plurality of first set of metal stripes with a plurality of first set of source metal stripes contacting said source metal contacts and a plurality of first set of drain metal stripes contacting said drain metal contacts;
   a second insulation layer covering said first set of metal stripes wherein said second insulation layer having a plurality of source via contacts and drain via contacts penetrate therethrough for contacting said first set of source metal strips and said first set of drain metal strips respectively;
   a second metal layer disposed on top of said second insulation layer and patterned into a source metal and a drain metal for contacting said source via contacts and said drain via contacts respectively through said second insulation layer; and
   said first metal layer is patterned into a said plurality of said first set of source and drain metal stripes with different width wherein a lower portion of said first set of source metal stripe is wider then a upper portion of said first set of source metal stripes to reduce a lower portion source resistance and said upper portion of said source metal stripes having a narrower width to allow for greater width for an upper portion of said drain metal stripes to reduce a drain resistance in an upper portion.

2. The semiconductor power device of claim 1 wherein: said gate electrode layer further comprising a polysilicon layer disposed on top and padded by an gate insulation layer on top of said semiconductor substrate and patterned into a plurality of wave-like shaped polysilicon stripes extended between and interconnecting two of said gate runners.

3. The semiconductor power device of claim 1 wherein: said gate electrode layer is patterned for further comprising a plurality of interconnections interconnected in parallel between gate runners to configure as gate electrode grid for reducing gate resistance.

4. The semiconductor power device of claim 3 wherein: said gate runners further extended across the substantial length over said semiconductor device to and connected to a gate pad disposed on a peripheral portion of said semiconductor substrate.

5. The semiconductor power device of claim 4 further comprising:
   a gate metal disposed on top of said semiconductor power device for contacting said gate pad to function as an external gate electrode.

6. The semiconductor power device of claim 1 wherein: said gate electrode layer is patterned to have a minimum distance between adjacent wave-like shaped stripes and between said gate runners across the substantially length of the semiconductor power device according to a manufacturing and minimum spacing design rule.

7. The semiconductor power device of claim 1 wherein: said source metal and said drain metal are disposed over said second insulation layer on two opposite sides on top of said semiconductor power device.

8. A semiconductor power device supported on a semiconductor substrate comprising:
   a plurality of transistor cells each having a source and a drain region disposed on opposite sides of a gate region in the semiconductor substrate wherein a gate electrode is formed as an electrode layer on top of the gate region for controlling an electric current transmitted between the source and the drain regions;
   said gate electrode layer disposed on top of said semiconductor substrate is patterned into a plurality of substantially parallel gate runners traverse substantially across an entire length of said semiconductor power device and wave-like shaped stripes extending along a perpendicular direction relative to said gate runners and interconnected between adjacent gate runners for substantially increasing an electric current conduction area between the source and drain regions across the gate;
   a first insulation layer covering said semiconductor device having a plurality of contact openings opened through said first insulation layer and said contact openings are filled with source metal contacts and drain metal contacts for contacting said source and drain regions respectively;

a first metal layer covering over said first insulation layer and patterned into a plurality of first set of metal stripes with a plurality of first set of source metal stripes contacting said source metal contacts and a plurality of first set of drain metal stripes contacting said drain metal contacts;

a second insulation layer covering said first set of metal stripes wherein said second insulation layer having a plurality of source via contacts and drain via contacts penetrate therethrough for contacting said first set of source metal strips and said first set of drain metal strips respectively;

a second metal layer disposed on top of said second insulation layer and patterned into a source metal and a drain metal for contacting said source via contacts and said drain via contacts respectively through said second insulation layer; and said first metal layer is patterned into said plurality of said first set of source and drain metal stripes with different width wherein a lower portion of said first set of source metal stripe is wider then a upper portion of said first set of source metal stripes to reduce a lower portion source resistance and said upper portion of said source metal stripes having a narrower width to allow for greater width for an upper portion of said drain metal stripes to reduce a drain resistance in an upper portion.

9. The semiconductor power device of claim 8 wherein:
said gate electrode layer further comprising a polysilicon layer disposed on top and padded by an gate insulation layer on top of said semiconductor substrate and patterned into a plurality of wave-like shaped polysilicon stripes extended between said parallel gate runners.

10. The semiconductor power device of claim 8 wherein:
a salicide layer disposed in an upper portion of said source region and said drain region for expanding an area of a source metal contact and a drain metal contact to contact a source metal and a drain metal for reducing a drain to source resistance.

11. The semiconductor power device of claim 8 wherein:
said gate runners further extended the substantial entire length of the semiconductor power device to and connected to a gate pad disposed on a peripheral portion of said semiconductor substrate.

12. The semiconductor power device of claim 11 further comprising:
a gate metal disposed on top of said semiconductor power device for contacting said gate pad to function as an external gate electrode.

13. The semiconductor power device of claim 8 wherein:
said gate electrode layer is patterned to have a minimum distance between adjacent wave-like shaped stripes and between said gate runners across the substantially entire length of the semiconductor power device according to a manufacturing and minimum spacing design rule.

14. The semiconductor power device of claim 8 wherein:
said source metal and said drain metal are disposed over said second insulation layer on two opposite sides on top of said semiconductor power device.

* * * * *